United States Patent
Bolter

(10) Patent No.: US 9,230,364 B2
(45) Date of Patent: Jan. 5, 2016

(54) ZEBRA LIGHTS

(71) Applicant: Autodesk, Inc., San Rafael, CA (US)

(72) Inventor: Robert Paul Bolter, Cambridge (GB)

(73) Assignee: Autodesk, Inc., San Rafael, CA (US)

( * ) Notice: Subject to any disclaimer, the term of this patent is extended or adjusted under 35 U.S.C. 154(b) by 356 days.

(21) Appl. No.: 13/757,189

(22) Filed: Feb. 1, 2013

(65) Prior Publication Data

US 2014/0218476 A1      Aug. 7, 2014

(51) Int. Cl.
| | | |
|---|---|---|
| *G06T 7/00* | (2006.01) |
| *G06T 15/50* | (2011.01) |
| *G06F 17/50* | (2006.01) |
| *G06F 11/263* | (2006.01) |
| *G06T 15/04* | (2011.01) |

(52) U.S. Cl.
CPC ............. *G06T 15/506* (2013.01); *G06T 7/0059* (2013.01); *G06T 15/503* (2013.01); *G06F 11/263* (2013.01); *G06F 17/50* (2013.01); *G06F 17/5086* (2013.01); *G06T 7/001* (2013.01); *G06T 15/04* (2013.01)

(58) Field of Classification Search
None
See application file for complete search history.

(56) References Cited

U.S. PATENT DOCUMENTS

| | | | | |
|---|---|---|---|---|
| 4,586,038 | A | * | 4/1986 | Sims et al. ..................... 345/586 |
| 5,659,671 | A | * | 8/1997 | Tannenbaum et al. ........ 345/426 |
| 7,042,457 | B2 | | 5/2006 | Rosel et al. |
| 2008/0143739 | A1 | * | 6/2008 | Harris et al. .................. 345/604 |
| 2010/0284589 | A1 | * | 11/2010 | Thiel et al. ..................... 382/128 |
| 2011/0004450 | A1 | * | 1/2011 | Mishelevich ............ A61N 2/02 703/2 |
| 2011/0043522 | A1 | * | 2/2011 | Zhou et al. ..................... 345/426 |
| 2012/0206457 | A1 | * | 8/2012 | Crocker ......................... 345/420 |
| 2014/0037146 | A1 | * | 2/2014 | Taguchi et al. ............... 382/107 |

OTHER PUBLICATIONS

Archive from Internet Archive Wayback Machine (http://archive.org/web/ )  "http://help.solidworks.com/2012/English/solidworks/sldworks/c_zebra_stripes.htm".*
Solidworks, Zebra Stripes Property Manager, "http://help.solidworks.com/2012/English/SolidWorks/sldworks/HIDD_ZEBRA_PROPERTIES.htm".*
Austodesk, Inc., 'Zebra Analysis—WikiHelp,' retreived on Aug. 8, 2012, from http://wikihelp.autodesk.com/Inventor_Fusion/enu/2013/Help/0156-Material156/0165-Zebra_An165, 4 pages.

* cited by examiner

*Primary Examiner* — Xiao Wu
*Assistant Examiner* — Steven Elbinger
(74) *Attorney, Agent, or Firm* — Fish & Richardson P.C.

(57) ABSTRACT

Methods, systems, and apparatus, including computer programs encoded on a computer storage medium, for rendering zebra stripes on a three dimensional (3D) object. In one aspect, a method includes rendering an image of an object from the perspective of a camera For each pixel of a plurality of pixels of the image, a point on the surface of the object corresponding to the pixel is determined. An angle between a surface normal at the point and a line between the point and the light source is determined. A zebra light color for the pixel is determined using a stripe function and the angle, the stripe function specifying alternating high and low intensities for various angles. A blended pixel color for the pixel is determined by blending a material color for the point with the zebra light color.

20 Claims, 12 Drawing Sheets
(8 of 12 Drawing Sheet(s) Filed in Color)

ZEBRA LIGHTS

BACKGROUND

This specification relates to three dimensional modeling on computers.

Zebra stripes are one way for designers to analyze the curvature and curvature flow of a three dimensional (3D) model. In conventional graphics systems, zebra strips are generated by application of a black and white striped environment map to the rendering process. By observing how the stripes bend as they cross an edge, a designer can determine whether the edge is a sharp edge or a smooth edge. A designer can observe stripes at a tangent edge, and if the stripes line up, the designer can confirm that the tangent edge is actually tangent.

SUMMARY

A graphics system renders zebra stripes on a 3D object using a specialized light source, a zebra light. A zebra light can be implemented in software or on common graphics hardware. A zebra light is a light source that renders stripes on a surface according to a stripe function of the angle between the surface normal and the light source. A zebra light can be a lighting equation incorporating a stripe function.

In general, one aspect of the subject matter described in this specification can be embodied in methods that include the actions of establishing a three dimensional (3D) scene, the 3D scene including: a 3D object including at least one surface; a camera facing the 3D object and oriented to a perspective; and a light source; rendering an image of the object from the perspective of the camera, including, for each pixel of a plurality of pixels of the image: determining a point on the surface of the object corresponding to the pixel; determining an angle between a surface normal at the point and a line between the point and the light source; determining a zebra light color for the pixel using a stripe function and the angle, the stripe function specifying alternating high and low intensities for various angles; and determining a blended pixel color for the pixel by blending a material color for the point with the zebra light color. Other embodiments of this aspect include corresponding systems, apparatus, and computer programs, configured to perform the actions of the methods, encoded on computer storage devices. A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

These and other embodiments can each optionally include one or more of the following features. The stripe function specifies a high intensity at regular intervals of the various angles and a low intensity at regular intervals of the various angles between the light colors. Determining the blended pixel color for the pixel comprises determining that the stripe function, for the angle, specifies the high intensity and selecting, as the blended pixel color, the material color for the point. Determining the blended pixel color for the pixel comprises determining that the stripe function, for the angle, specifies the low intensity and selecting, as the blended pixel color, a fixed color. A stripe width of the stripe function is zero, the stripe width specifying a number of consecutive angles for which the stripe function specifies the high intensity, thereby resulting in one or more stripes on the surface that are one pixel wide. Rendering the image further comprises: determining a rate of change of the angle with respect to the pixel; and determining the stripe function using the rate of change of the angle, including varying a rate of change of the intensity of the stripe function using the rate of change of the angle. Establishing the 3D scene includes fixing the light source relative to the camera, so that the light source moves automatically when the camera is moved, or fixing the light source at a location in model space. The light source is a point light source or an infinite directional light source. Establishing the 3D scene includes establishing a different light source at a different location from a location of the light source, and rendering the image of the object as lit by the light source and the different light source.

Particular embodiments of the subject matter described in this specification can be implemented so as to realize one or more of the following advantages. A graphics system can render zebra stripes without under-sampling the environment map or aliasing (over-sampling the environment map). A user of the system can orient a zebra light so that the zebra stripes go in a desired direction, e.g., orthogonal to an edge, so that the user does not have to rotate the view or switch between different orientations of the environment map. The system can render zebra stripes on ruled surfaces. The original color and shading of an object can be preserved. The system can render zebra stripes that are a single pixel wide. The system can generate iso-angle plots and contour plots. Multiple zebra lights of different orientations can be combined in the same image.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Like reference numbers and designations in the various drawings indicate like elements.

DETAILED DESCRIPTION

Figure 1:
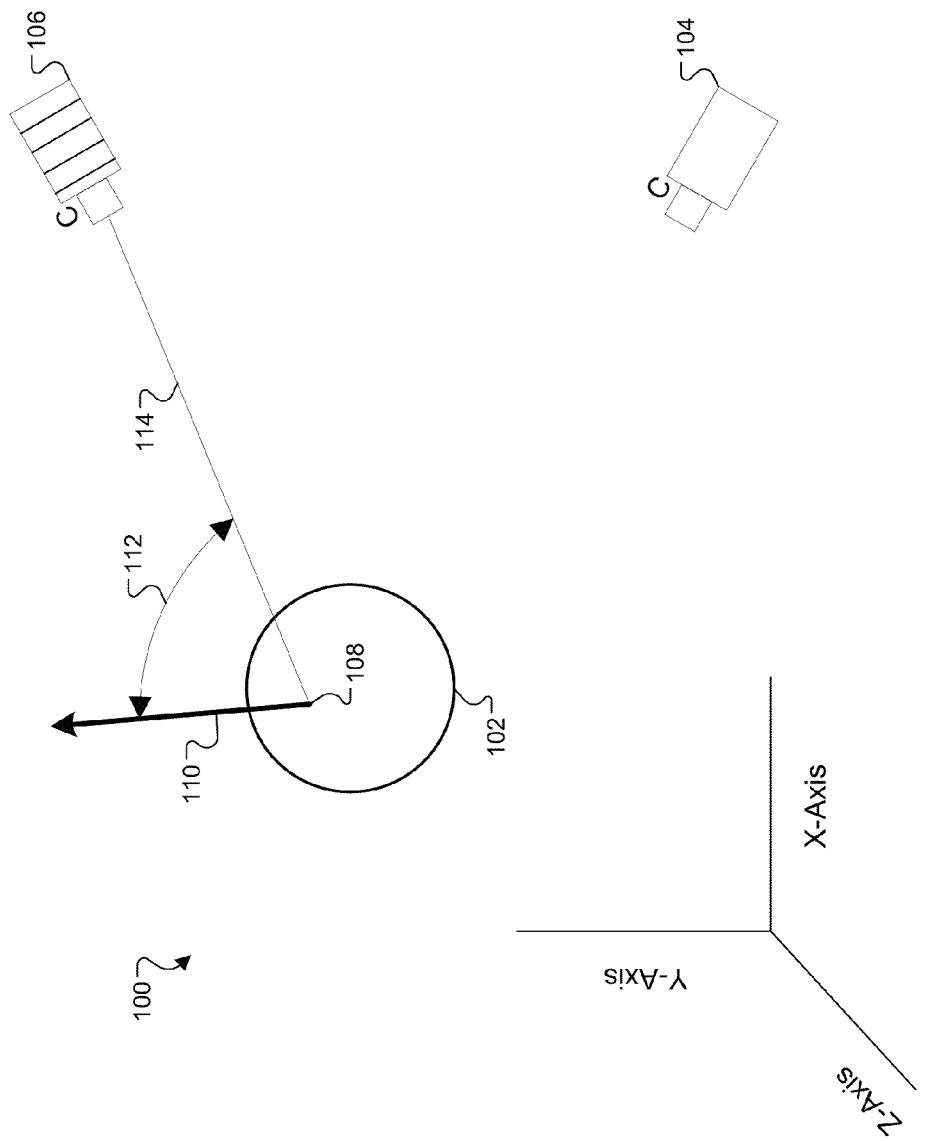
FIG. 1 illustrates an example three dimensional (3D) scene 100 as displayed in a user interface of a graphics system.
Figure 2A:
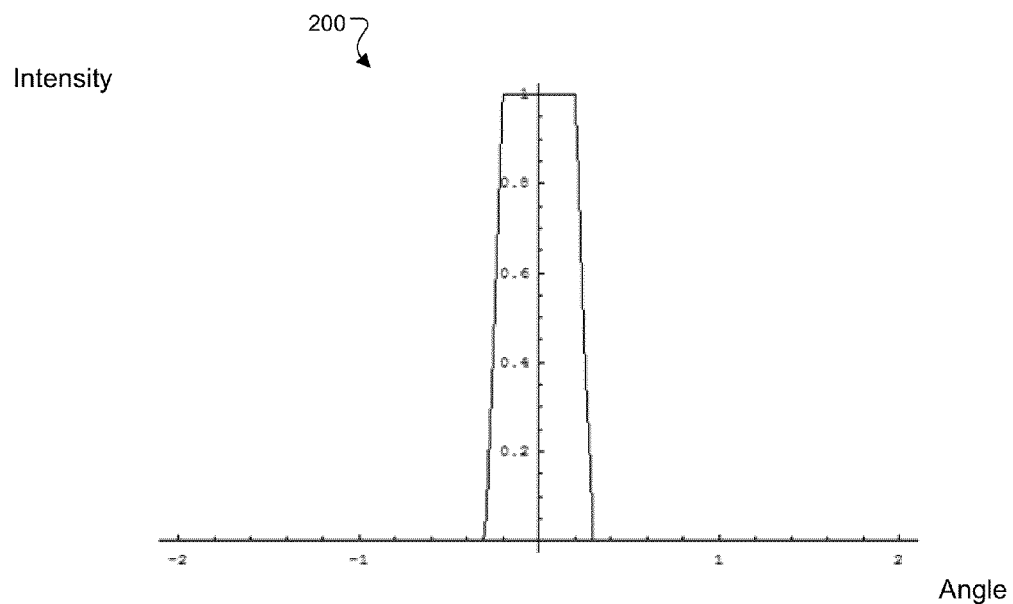
FIGS. 2A-D are charts illustrating example stripe functions 200, 220, 240, and 260.
Figure 2B:
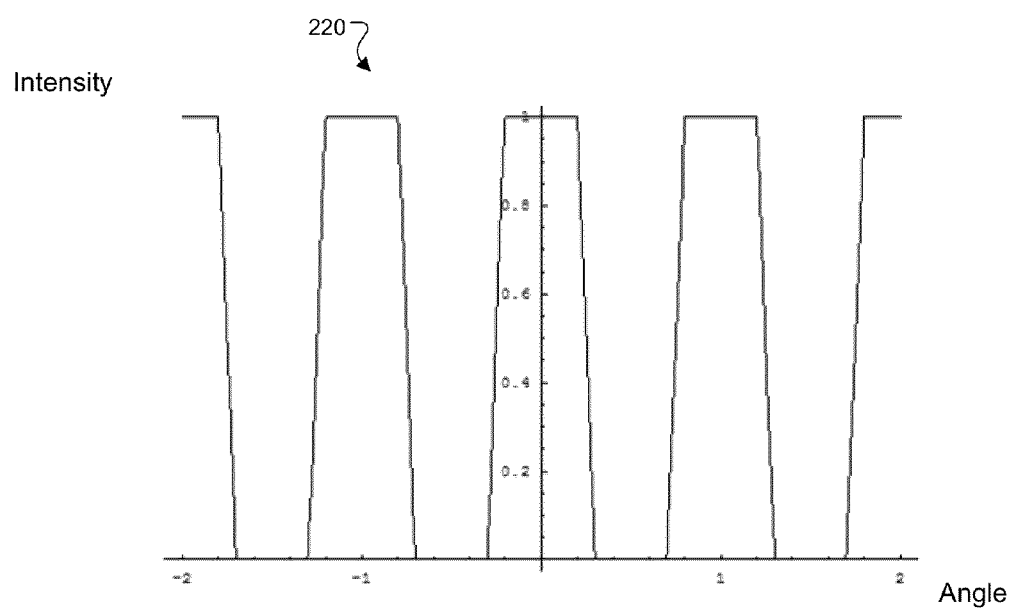
Figure 2C:
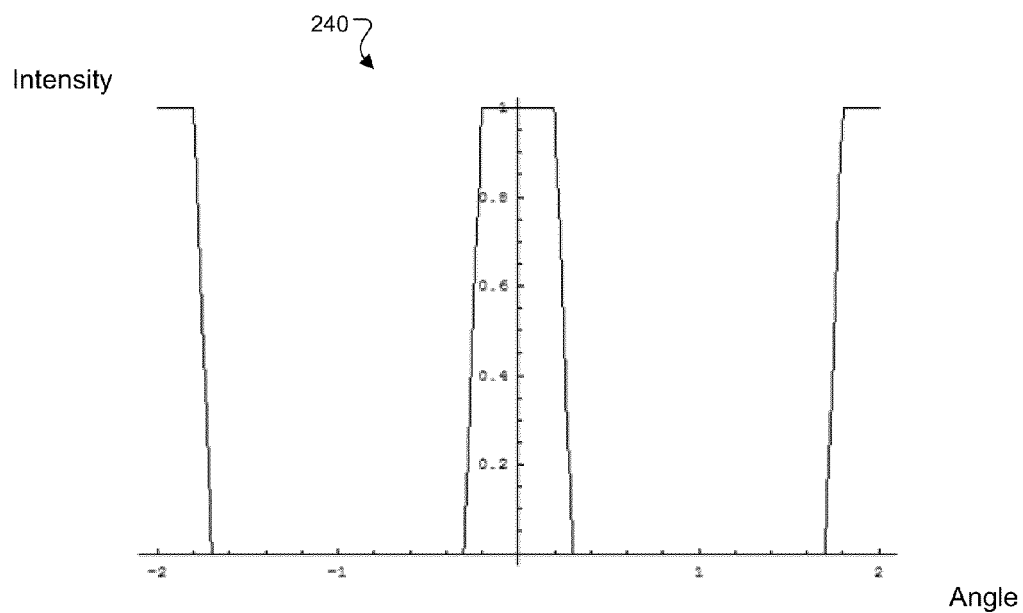
Figure 2D:
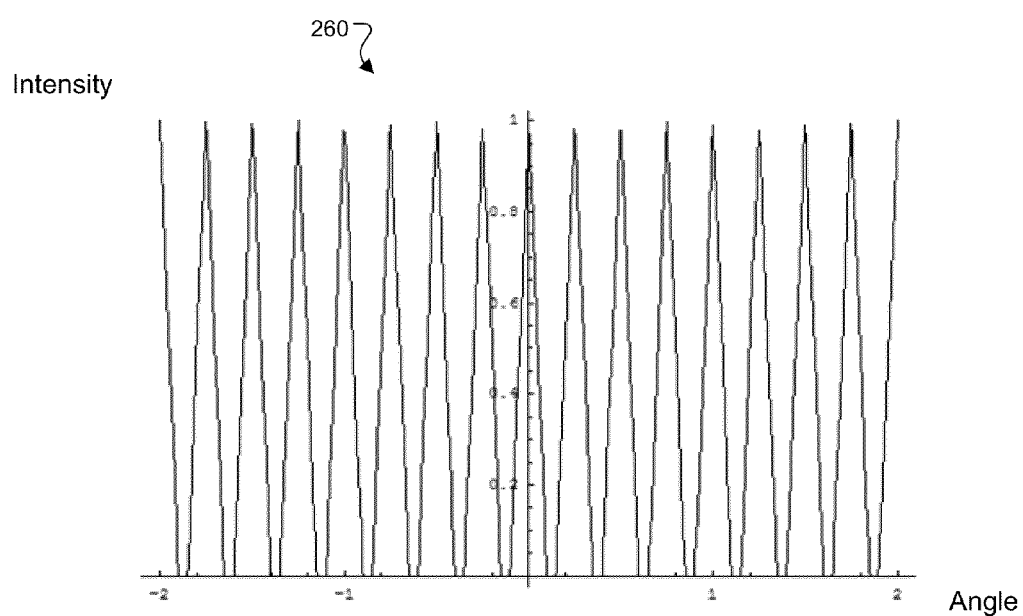

FIG. 1 illustrates an example three dimensional (3D) scene 100 as displayed in a user interface of a graphics system. The 3D scene includes an object 102, a camera 104, and a zebra light source 106. A user can place the zebra light source into the scene to render an image of the scene so that the object is displayed with zebra stripes on a surface of the object.

The zebra light source is a light source that renders stripes according to a function (a "stripe function") of the angle between a surface normal and the zebra light source. The stripe function specifies alternating high and low intensities for various angles. The zebra light source can be implemented in common graphics hardware, which is typically configured to implement a standard light source. For example, the graphics system can execute software based on the Open Graphics Library (OpenGL) and using a hardware Graphics Processing Unit (GPU). The zebra light source can act like a standard light source that only shines lights onto the stripes of the surface as defined by the stripe function.

The graphics system renders an image of the object from the perspective of the camera. For each pixel of the image, the graphics system determines a corresponding point 108 on the surface of the object—the point that is seen by the camera for that pixel. The graphics system determines a surface normal 110 for the point. The surface normal is a vector pointing perpendicular to the surface at the point. The surface normal can be stored as information with the object or the 3D scene or the graphics system can determine the normal by analyzing the surface.

The graphics system determines the angle 112 between the surface normal 110 and a line 114 between the zebra light source and the point. The graphics system determines a zebra light color for the pixel using the stripe function and the angle. The graphics system can also determine a material color for the point, e.g., using conventional rendering techniques. The graphics system determines a blended pixel color for the pixel by blending the material color for the point with the zebra light color.

FIGS. 2A-D are charts illustrating example stripe functions 200, 220, 240, and 260. The stripe function specifies intensities for various angles between a surface normal and a zebra light source. A graphics system can generate the stripe function using parameters. For purposes of illustration, consider three example parameters, a stripe density, a stripe width, and a rate of change of the angle.

The stripe density controls the number of stripes in a given range of angles, e.g., 0-180 degrees. A stripe is a range of angles for which the stripe function specifies a minimum or maximum intensity. The stripe width specifies the width of a stripe, e.g., a range of angles for which the intensity is a maximum intensity. The graphics system can determine the rate of change of the angle with respect to the pixel, or an approximate rate of change, and use that rate of change to determine the slope of the stripes.

Consider three example stripe functions, a spike function, a zebra function, and a zebra function density function:

$$ClipFunction\ [x\_] := \begin{cases} 0 & x < 0 \\ 1 & x > 1 \\ x & 0 <= x \le 1 \end{cases}$$

$$SpikeFunction\ [x\_, dx\_, width\_] :=$$

$$ClipFunction\left[\begin{cases} \dfrac{d + \dfrac{width}{2} + x}{dx} & x < 0 \\ \dfrac{dx + \dfrac{width}{2} - x}{dx} & x \ge 0 \end{cases}\right]$$

$$ZebraFunction\ [x\_, dx\_, width\_] :=$$
$$SpikeFunction\ [x - \text{Round}\ [x], dx, width]$$

$$ZebraFunctionDensity\ [x\_, dx\_, width\_, density\_] :=$$
$$ZebraFunction\ [x * density, dx * density, width]$$

The spike function creates a single spike centered at 0, the zebra function makes spikes at 0, 1, 2, 3, and so on. The zebra function density function creates density spikes. A stripe function does not necessarily have to take an angle as its input.

Figure 3:
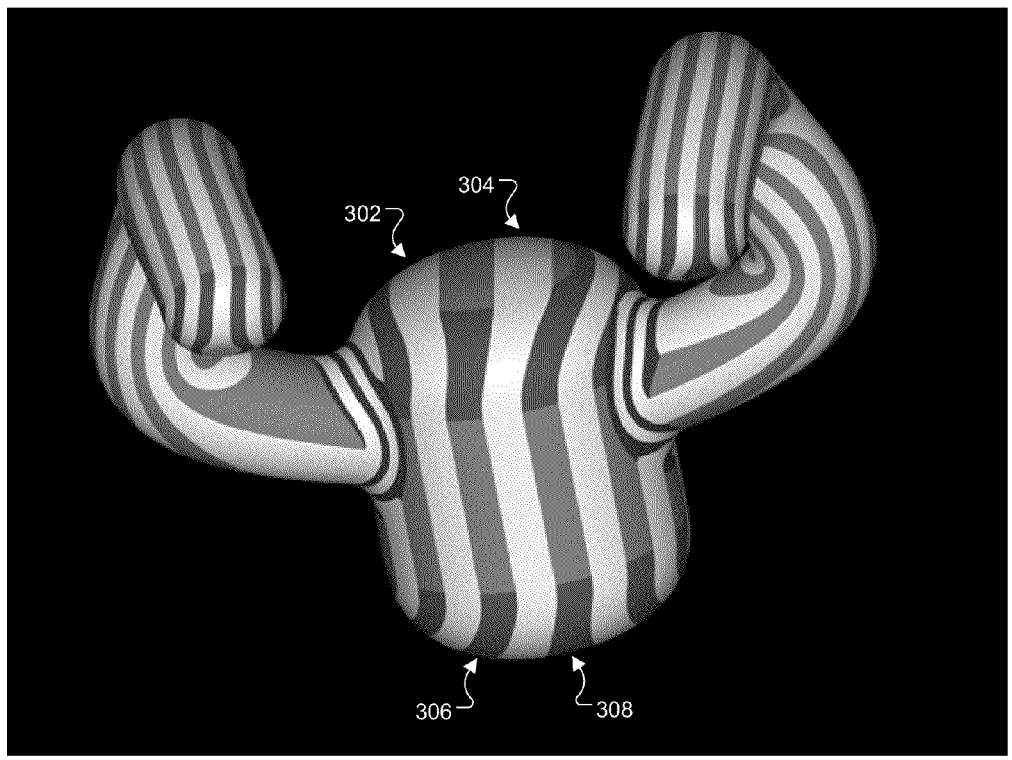
FIG. 3 is an example image of an object rendered by a graphics system from the perspective of a camera as lit by a zebra light.

FIG. 3 is an example image of an object rendered by a graphics system from the perspective of a camera as lit by a zebra light. The white stripes, e.g., 302 and 304, are areas of the object where the stripe function has a high intensity. In this example, the zebra stripe color is white, so the stripes are white, but other colors can be used. The colored stripes, e.g., 306 and 308, are areas of the object where the stripe function has a low intensity. For these stripes, the color of the object is used during rendering, e.g., red, green, or blue. In this manner, some of the object's underlying color is preserved.

Figure 4:
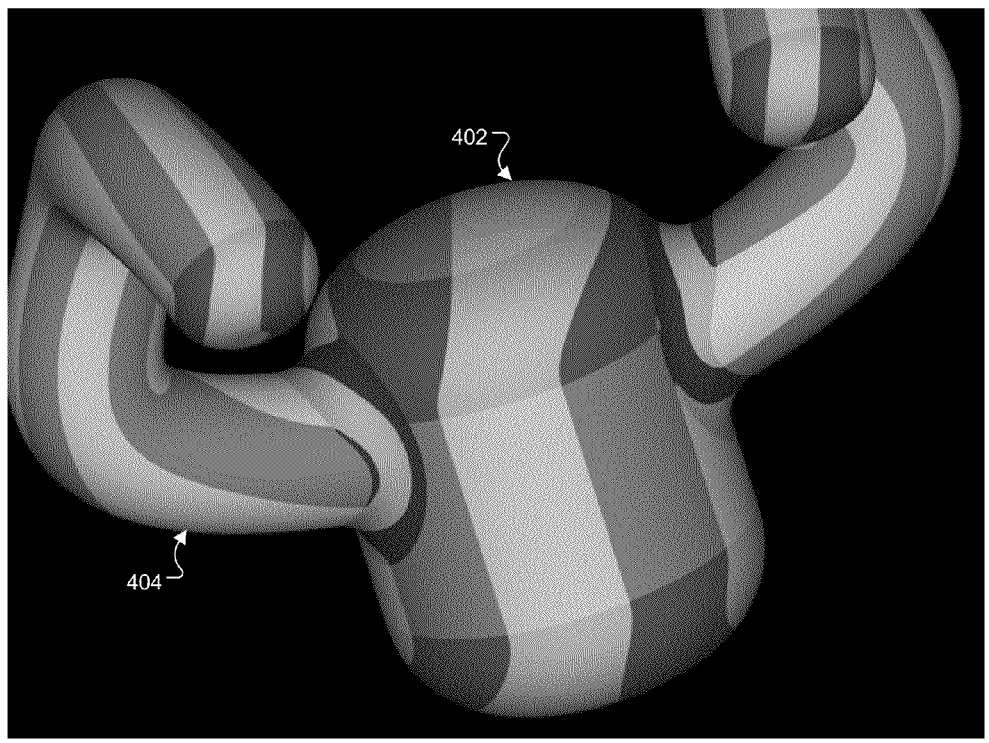
FIG. 4 is another example image of the object.

FIG. 4 is another example image of the object. The graphics system can render this image using a stripe function with a smaller stripe density than used for the image of FIG. 3. Hence, there are fewer stripes, e.g., 402 and 404, on the object. Moreover, the maximum intensity of the stripe function is lower than the maximum intensity used for the image of FIG. 3. Consequently, the stripes are not solid white. Instead, the stripes show some of the underlying material colors blended with the white zebra stripe color.

Figure 5:
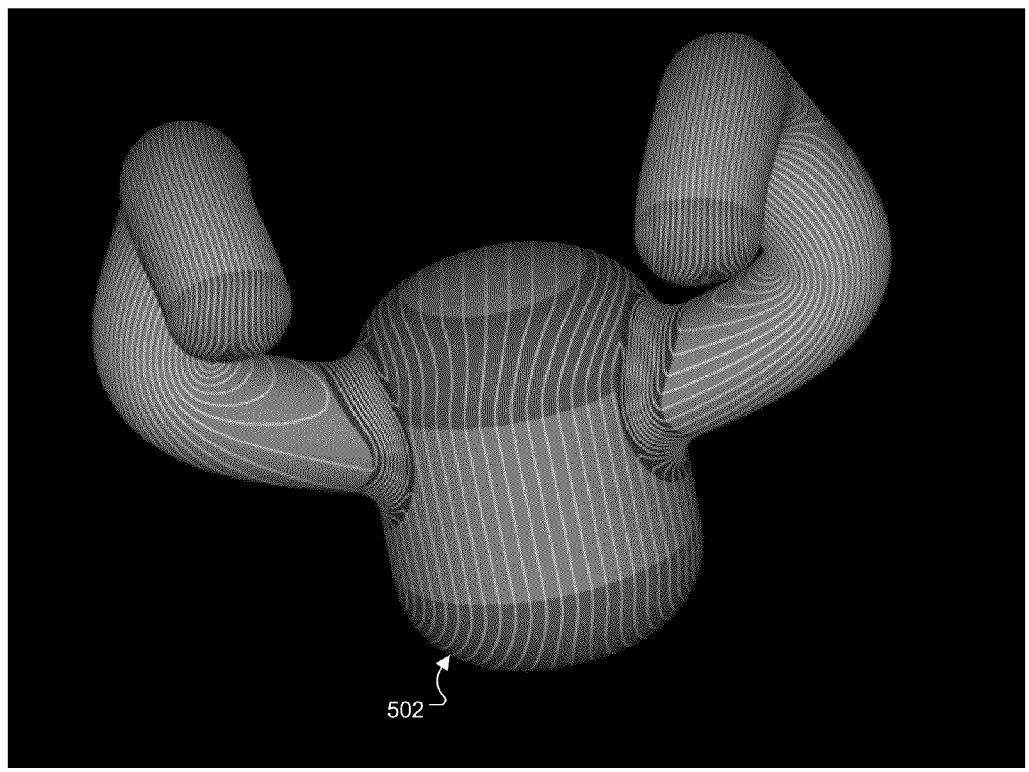
FIG. 5 is another example image of the object.

FIG. 5 is another example image of the object. The graphics system can render this image using a stripe function with a stripe width of zero. When the stripe width is zero, the resulting stripes are one pixel wide.

Figure 6:
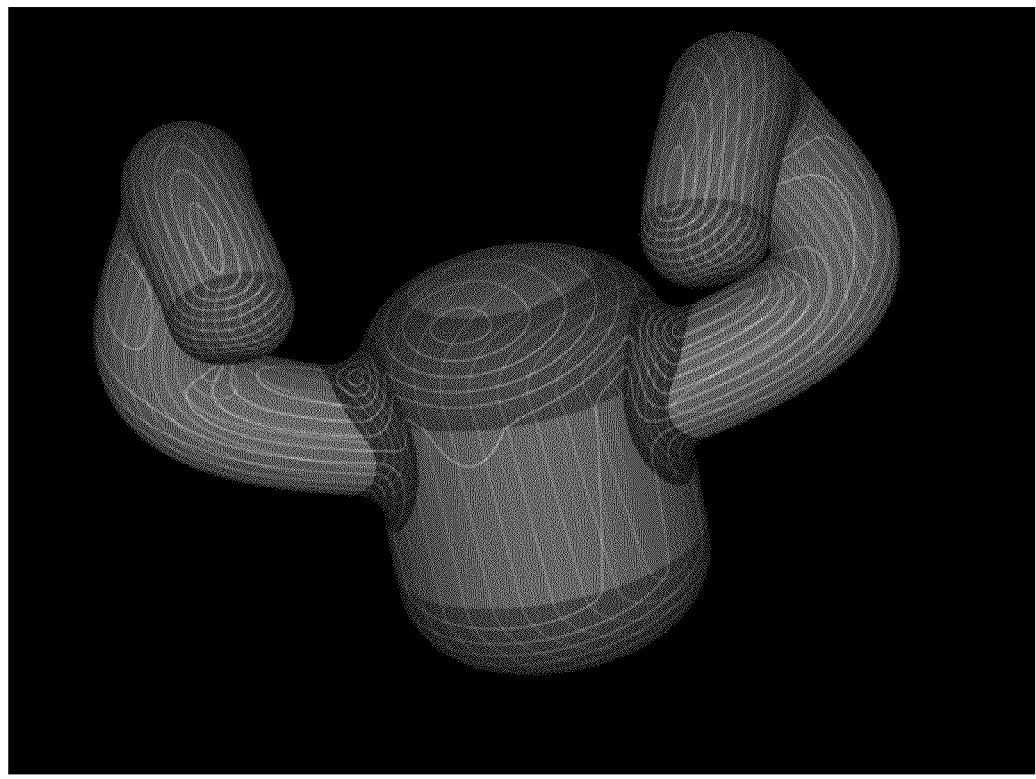
FIG. 6 is another example image of the object rendered by a graphics system from the perspective of a camera as lit by three different zebra lights.

FIG. 6 is another example image of the object rendered by a graphics system from the perspective of a camera as lit by three different zebra lights. The three zebra lights are positioned at three evenly spaced positions behind the camera. Each light has a different color—one is red, one is blue, and one is green, resulting in red stripes, blue stripes, and green stripes. Using multiple zebra lights, a user can create enough zebra stripes so that at least one stripe is in each location and direction that the user is interested in. Blending the stripe color with the standard shading of the surface can give the user more information about the form of the surface of the object.

Figure 7:
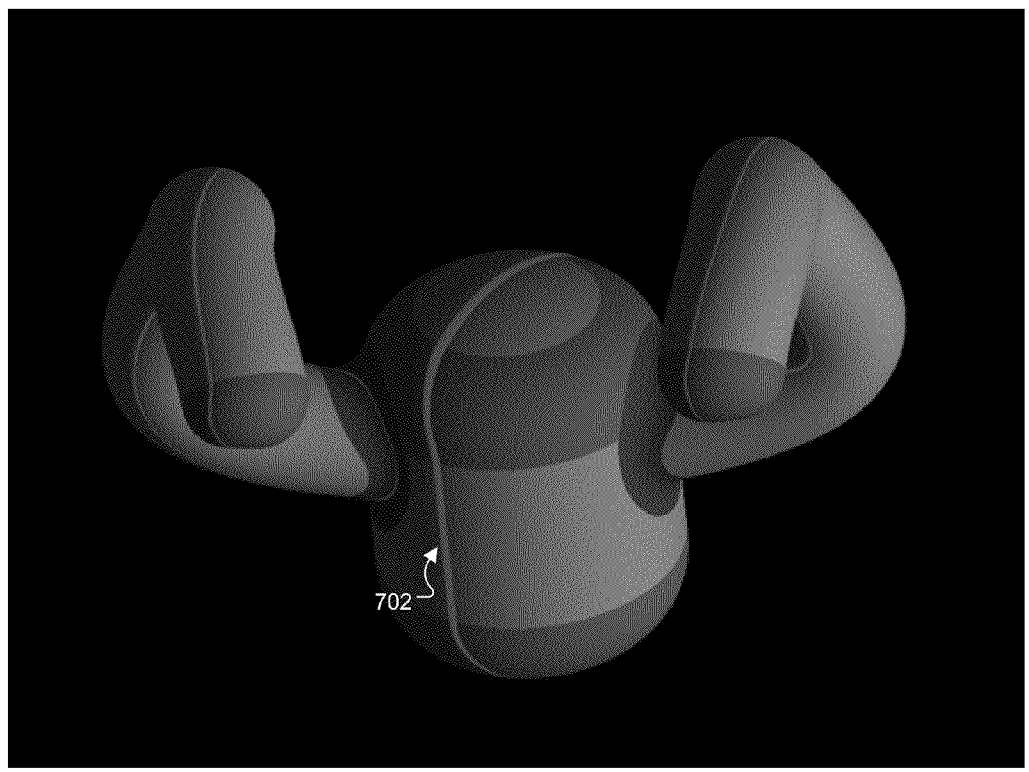
FIG. 7 is another example image of the object.

FIG. 7 is another example image of the object. The graphics system can render this image by varying the stripe density of the stripe function, resulting in an iso-angle plot over the object. The iso-angle plot comprises a single line 702.

Figure 8:
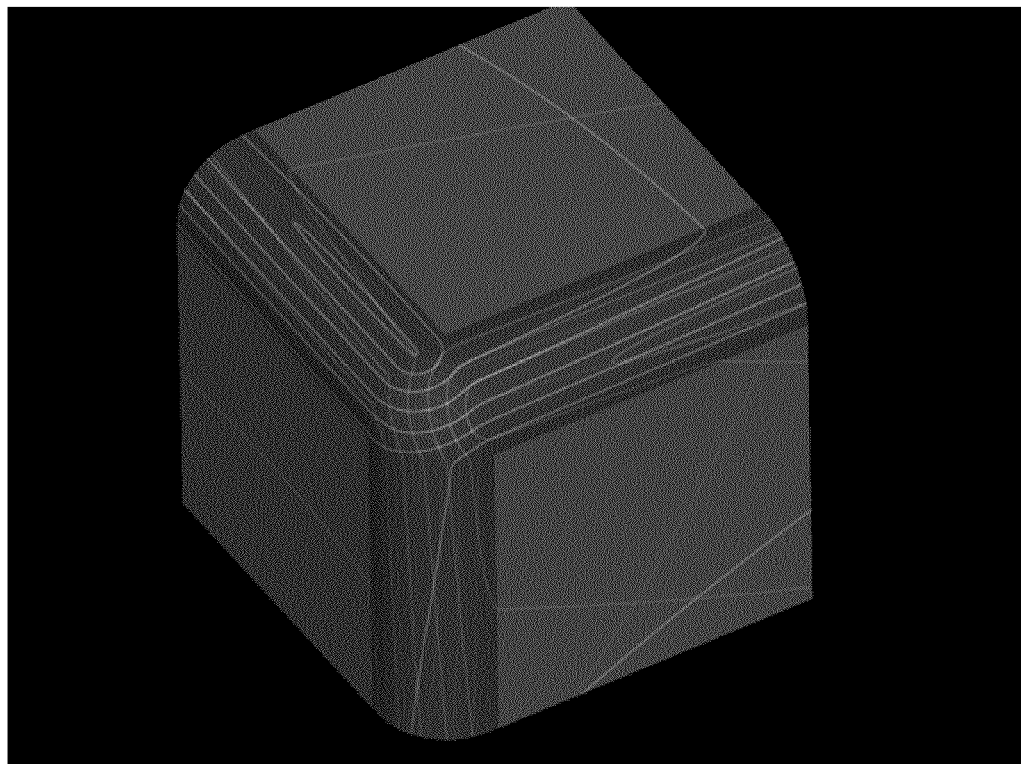
FIG. 8 is an example image of a ruled object rendered by a graphics system from the perspective of a camera as light by multiple zebra lights.

FIG. 8 is an example image of a ruled object rendered by a graphics system from the perspective of a camera as light by multiple zebra lights. Using multiple zebra lights, a user can create zebra stripes that give the user information about the contour of the ruled object.

Figure 9A:
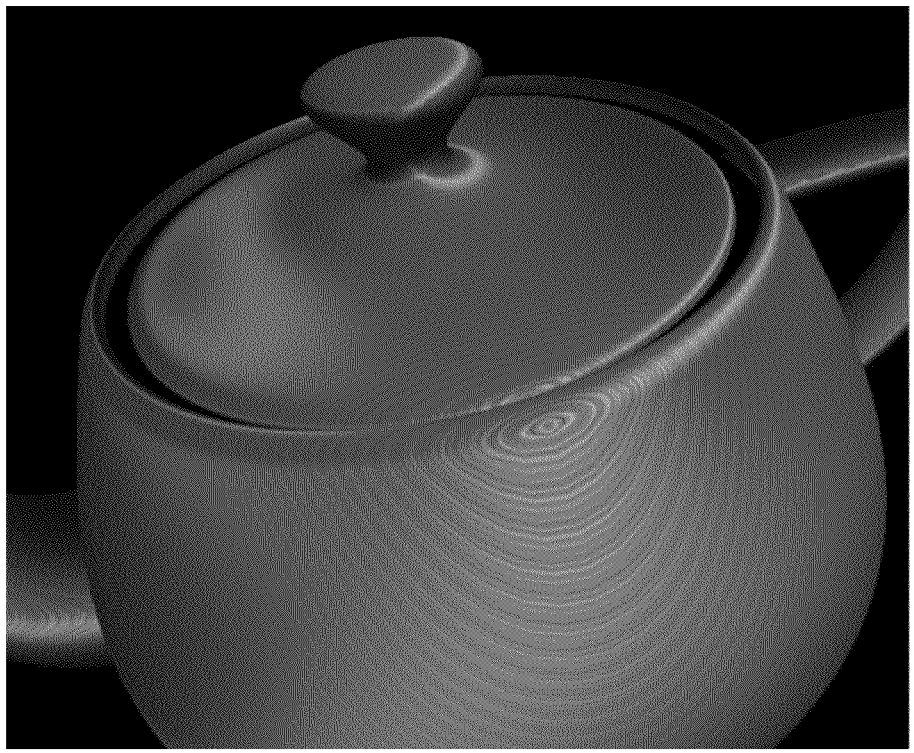
FIG. 9A is an example image of a teapot rendered by a graphics system from the perspective of a camera as lit by a standard light.
Figure 9B:
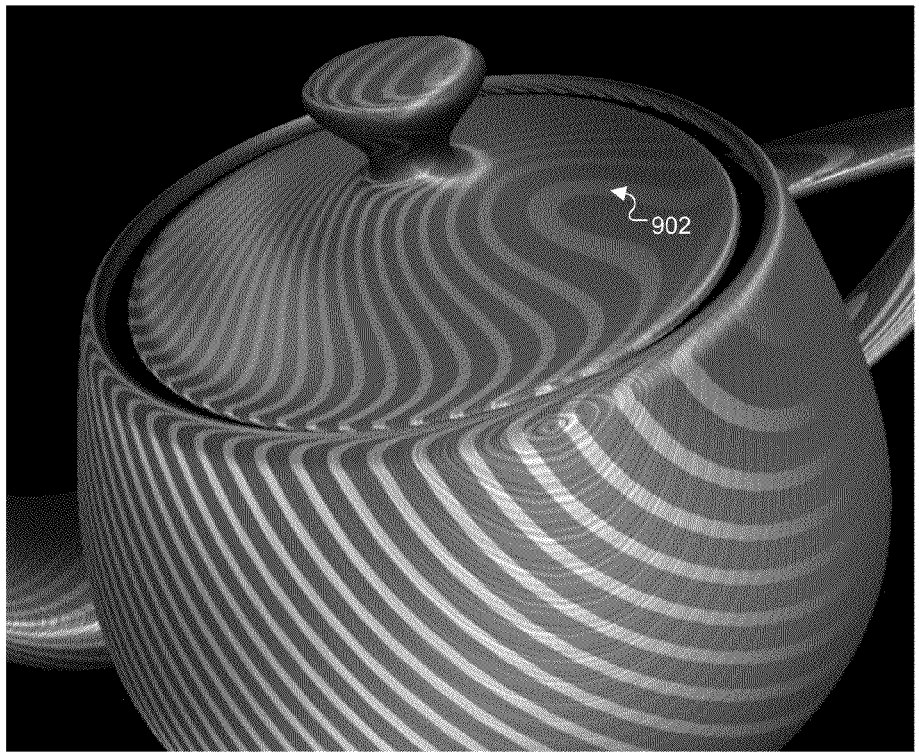
FIG. 9B is another example image of the teapot rendered by the graphics system from the same camera as lit by a zebra light.

FIG. 9A is an example image of a teapot rendered by a graphics system from the perspective of a camera as lit by a light with a brushed metal effect. FIG. 9B is another example image of the teapot rendered by the graphics system from the same camera as lit by a zebra light with the brushed metal effect. The zebra light produces stripes, e.g., stripe 902, that assist the user in visualizing the surface of the lid of the teapot.

Figure 10:
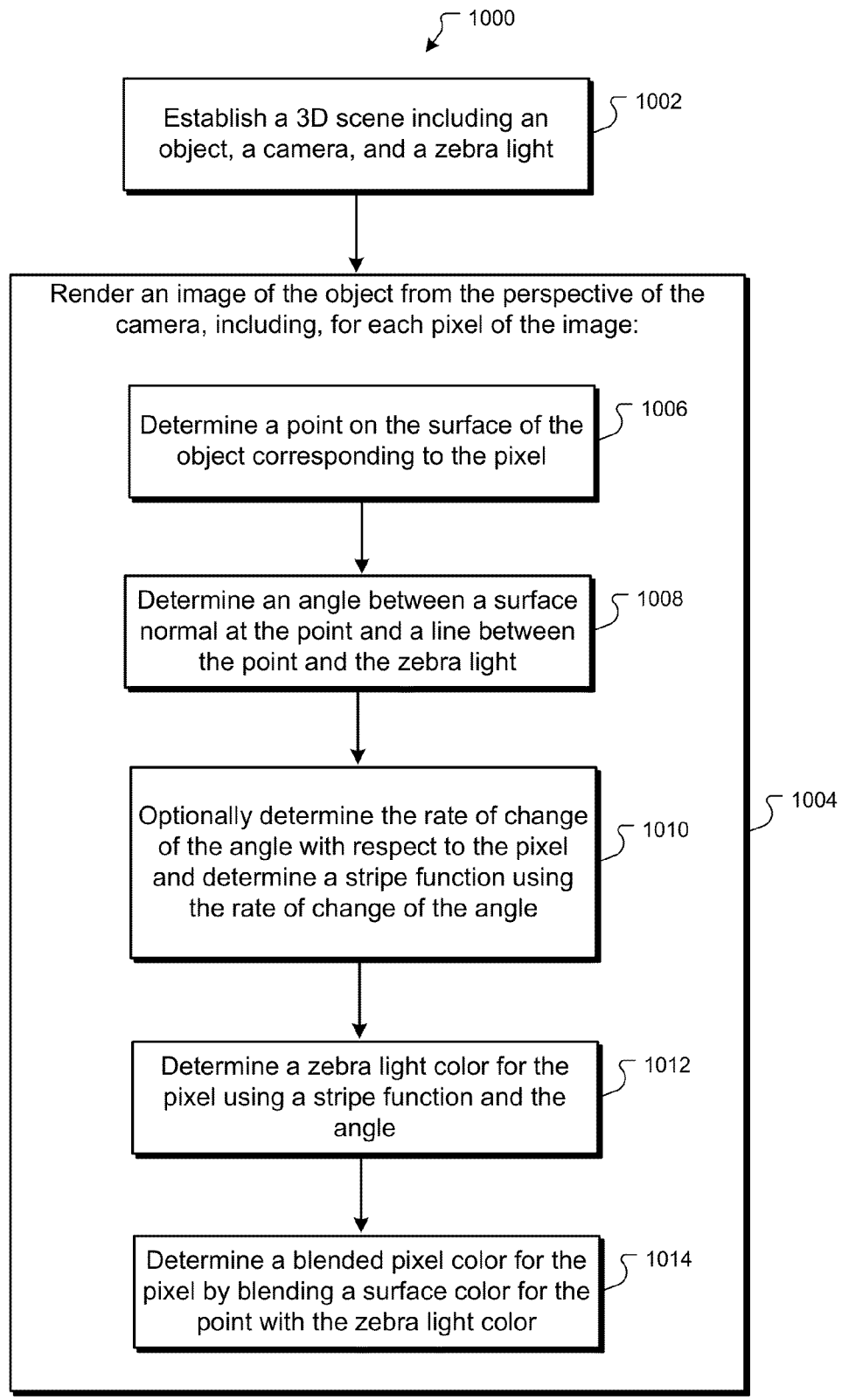
FIG. 10 is a flow diagram of an example process 1000 for rendering an image using zebra lights.

FIG. 10 is a flow diagram of an example process 1000 for rendering an image using one or more zebra lights. In some implementations, a system of one or more computers performs the process 1000. For example, a graphics system running OpenGL and using a GPU can perform the process. For convenience, the process will be described with respect to a system that performs the process 1000.

The system establishes a 3D scene including at least one 3D object, at least one camera, and at least one zebra light. The 3D object has at least one surface. The camera faces the 3D object and is oriented to a perspective. The zebra light can face the 3D object.

The system renders an image of the object from the perspective of the camera (1004). For each pixel of the image, the system performs steps 1006-1014.

The system determines a point on the surface of the object corresponding to the pixel (1006). The system determines an angle between a surface normal at the point and a line between the point and the zebra light (1008). In some implementations, the zebra light source is an infinite zebra light source, and the system determines the angle between the surface normal and the zebra light direction specified by the infinite zebra light source.

The system optionally determines the rate of change of the angle with respect to the pixel and determines a stripe function using the rate of change of the angle (1010). For example, the system can generate a stripe function as illustrated in FIG. 2, using the rate of change of the angle, a stripe density, and a stripe width. In some implementations, the system presents a user interface element, e.g., a dialog box, to a user and receives values for the stripe density and stripe width from the user. In some implementations, the system uses a predefined stripe function, e.g., by reading a stripe function from a file. The stripe function specifies alternating high and low intensities for various angles.

The system determines a zebra light color for the pixel using the stripe function and the angle (1012). For example, the system can present a user interface element, e.g., a color picker, to a user and receive a zebra light color selection, or the system can read the zebra light color selection from a file. The system uses the intensity specified by the stripe function at the angle to determine the intensity of the zebra light color selection, resulting in the determined zebra light color.

The system determines a blended pixel color for the pixel by blending a material color for the point with the zebra light color (1014). For example, if the zebra light color has a high intensity, the system can determine that the blended pixel color only from the zebra light color, and if the zebra light color has a low intensity, the system can determine the blended pixel color only from the material color.

The system can determine the material color using conventional rendering techniques. The material color can be based on, e.g., one or more material color properties, e.g., one or more colors or texture samples or both. The system can use any appropriate lighting model and shading, e.g., phong shading, or a brushed metal effect, or no shading at all.

In some implementations, the system determines the blended pixel color by first blending the zebra light color with the material color and then applying a lighting model to the blended pixel color. In some other implementations, the system determines the blended pixel color by first applying the lighting model with the material color and then blending the resulting color with the zebra light color.

After the system renders the pixels of the image, the system can display the image to a user. The image will show the object with zebra stripes on it. The user can inspect the image, and then optionally change the view, e.g., by moving the camera, adding more zebra lights, changing the stripe density or stripe width, rotating the object, and so on, and the system can then render the image again.

In some implementations, zebra light sources can be fixed in space, causing the appearance of static zebra stripes that do not change as the user changes the view, e.g., by rotating and panning the camera position. In some implementations, zebra light sources can be fixed relative to the camera, allowing the user to inspect the model by changing the view. Additional controls can be provided to the user to re-position the lights dynamically, either relative to the camera or fixed to the camera.

In some implementations, the system can position the zebra light sources dynamically as the user moves a cursor over the surface to inspect a particular part of the surface. For example, the system can position a zebra light source according to the position of the cursor and one or more surface properties of the surface at the cursor. The system can position infinite zebra lights with, e.g., the surface normal direction, one or both of the directions of principal curvature, or all three. The system can position point zebra lights in the same way with a position that is a certain distance from the surface point along those same directions.

Figure 11A:
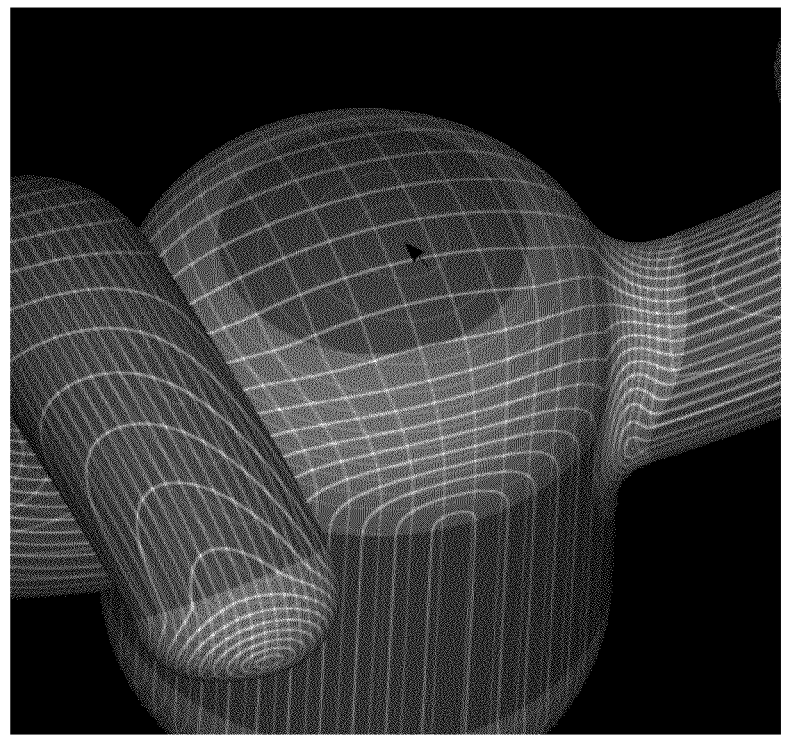
FIGS. 11A-B are example images of the object illustrating a user moving the cursor over the object and the system automatically adjusting zebra lights.
Figure 11B:
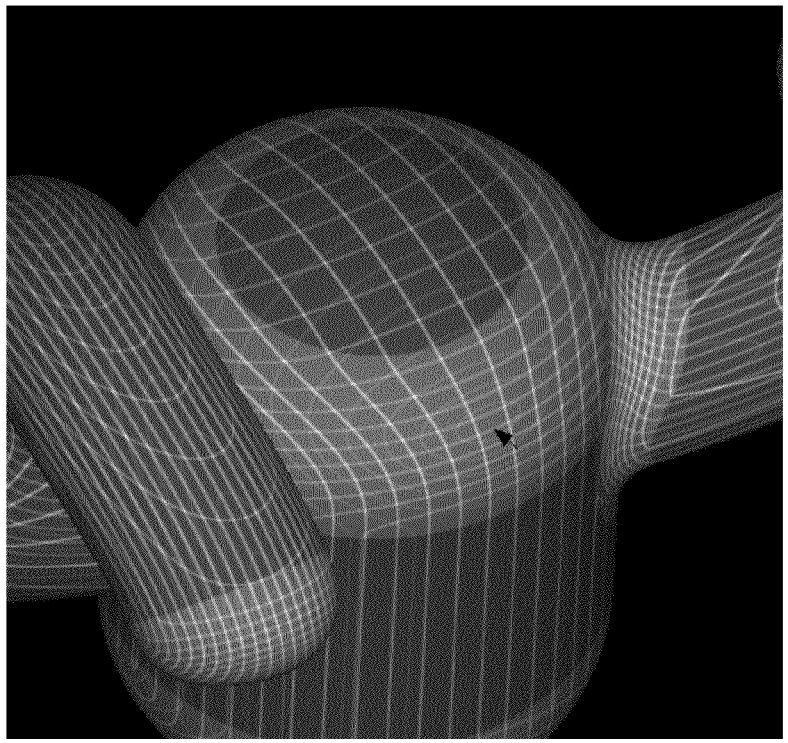

FIGS. 11A-B are example images of the object illustrating a user moving the cursor over the object and the system automatically adjusting zebra lights. The blue stripes are based on a zebra light positioned according to the surface normal direction. The green and blue stripes are based on zebra lights positioned according the principle curvature directions.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method performed by one or more computers, the method comprising:
   establishing a three dimensional (3D) scene, the 3D scene including:
      a 3D object including at least one surface;
      a camera facing the 3D object and oriented to a perspective; and
      a light source;
   determining a stripe function using a stripe density and a stripe width, wherein the stripe function specifies alternating high and low intensities for various angles between a surface normal and the light source;
   rendering an image of the object from the perspective of the camera, including, for each pixel of a plurality of pixels of the image:
      determining a point on the surface of the object corresponding to the pixel;
      determining an angle between a surface normal at the point and a line between the point and the light source;
      determining a zebra light color for displaying the pixel using the stripe function and the angle, comprising determining an intensity value of the zebra light color specified by the stripe function at the angle, wherein a particular intensity value of a particular zebra light color for a particular stripe varies as a function of the angle; and
      determining a blended pixel color for displaying the pixel by blending a material color for the point with the zebra light color.

2. The method of claim 1, wherein the stripe function specifies a high intensity at regular intervals of the various angles and a low intensity at regular intervals of the various angles between the light colors.

3. The method of claim 2, wherein determining the blended pixel color for the pixel comprises determining that the stripe function, for the angle, specifies the high intensity and selecting, as the blended pixel color, the material color for the point.

4. The method of claim 3, wherein the stripe width is zero, the stripe width specifying a number of consecutive angles for which the stripe function specifies the high intensity, thereby resulting in one or more stripes on the surface that are one pixel wide.

5. The method of claim 2, wherein determining the blended pixel color for the pixel comprises determining that the stripe function, for the angle, specifies the low intensity and selecting, as the blended pixel color, a fixed color.

6. The method of claim 1, wherein rendering the image further comprises:
   determining a rate of change of the angle with respect to the pixel; and
   wherein determining the stripe function comprises using the rate of change of the angle, including varying a rate of change of the intensity of the stripe function using the rate of change of the angle.

7. The method of claim 1, wherein establishing the 3D scene includes fixing the light source relative to the camera, so that the light source moves automatically when the camera is moved, or fixing the light source at a location in model space.

8. The method of claim 1, wherein the light source is a point light source or an infinite directional light source.

9. The method of claim 1, wherein establishing the 3D scene includes establishing a different light source at a different location from a location of the light source, and rendering the image of the object as lit by the light source and the different light source.

10. A non-transitory computer storage medium encoded with a computer program, the computer program comprising instructions, that when executed by data processing apparatus, cause the data processing apparatus to perform operations comprising:
    establishing a three dimensional (3D) scene, the 3D scene including:
       a 3D object including at least one surface;
       a camera facing the 3D object and oriented to a perspective; and
       a light source;
    determining a stripe function using a stripe density and a stripe width, wherein the stripe function specifies alternating high and low intensities for various angles between a surface normal and the light source;
    rendering an image of the object from the perspective of the camera, including, for each pixel of a plurality of pixels of the image:
       determining a point on the surface of the object corresponding to the pixel;
       determining an angle between a surface normal at the point and a line between the point and the light source;
       determining a zebra light color for displaying the pixel using the stripe function and the angle, comprising determining an intensity value of the zebra light color specified by the stripe function at the angle, wherein a particular intensity value of a particular zebra light color for a particular stripe varies as a function of the angle; and
       determining a blended pixel color for displaying the pixel by blending a material color for the point with the zebra light color.

11. The non-transitory computer storage medium of claim 10, wherein the stripe function specifies a high intensity at regular intervals of the various angles and a low intensity at regular intervals of the various angles between the light colors.

12. The non-transitory computer storage medium of claim 11, wherein determining the blended pixel color for the pixel comprises determining that the stripe function, for the angle, specifies the high intensity and selecting, as the blended pixel color, the material color for the point.

13. The non-transitory computer storage medium of claim 12, wherein the stripe width is zero, the stripe width specifying a number of consecutive angles for which the stripe function specifies the high intensity, thereby resulting in one or more stripes on the surface that are one pixel wide.

14. The non-transitory computer storage medium of claim 11, wherein determining the blended pixel color for the pixel comprises determining that the stripe function, for the angle, specifies the low intensity and selecting, as the blended pixel color, a fixed color.

15. The non-transitory computer storage medium of claim 10, wherein rendering the image further comprises:
   determining a rate of change of the angle with respect to the pixel; and
   wherein determining the stripe function comprises using the rate of change of the angle, including varying a rate of change of the intensity of the stripe function using the rate of change of the angle.

16. The non-transitory computer storage medium of claim 10, wherein establishing the 3D scene includes fixing the light source relative to the camera, so that the light source moves automatically when the camera is moved, or fixing the light source at a location in model space.

17. The non-transitory computer storage medium of claim 10, wherein the light source is a point light source or an infinite directional light source.

18. The non-transitory computer storage medium of claim 10, wherein establishing the 3D scene includes establishing a different light source at a different location from a location of the light source, and rendering the image of the object as lit by the light source and the different light source.

19. A system of one or more computers configured to perform operations comprising:
   establishing a three dimensional (3D) scene, the 3D scene including:
      a 3D object including at least one surface;
      a camera facing the 3D object and oriented to a perspective; and
      a light source;
   determining a stripe function using a stripe density and a stripe width, wherein the stripe function specifies alternating high and low intensities for various angles between a surface normal and the light source;
   rendering an image of the object from the perspective of the camera, including, for each pixel of a plurality of pixels of the image:
      determining a point on the surface of the object corresponding to the pixel;
      determining an angle between a surface normal at the point and a line between the point and the light source;
      determining a zebra light color for displaying the pixel using the stripe function and the angle, comprising determining an intensity value of the zebra light color specified by the stripe function at the angle, wherein a particular intensity value of a particular zebra light color for a particular stripe varies as a function of the angle; and
      determining a blended pixel color for displaying the pixel by blending a material color for the point with the zebra light color.

20. The system of claim 19, wherein the stripe function specifies a high intensity at regular intervals of the various angles and a low intensity at regular intervals of the various angles between the light colors.

* * * * *

UNITED STATES PATENT AND TRADEMARK OFFICE
CERTIFICATE OF CORRECTION

PATENT NO. : 9,230,364 B2  
APPLICATION NO. : 13/757189  
DATED : January 5, 2016  
INVENTOR(S) : Robert Paul Bolter Page 1 of 1

It is certified that error appears in the above-identified patent and that said Letters Patent is hereby corrected as shown below:

Title page,
Item (56) (OTHER PUBLICATIONS), line 7: Please delete "Austodesk," and insert --Autodesk,--, therefor.

Item (56) (OTHER PUBLICATIONS), line 7: Please delete "retreived" and insert --retrieved--, therefor.

Item (57) (ABSTRACT), line 5: Please delete "camera" and insert --camera.--, therefor.

Signed and Sealed this  
Nineteenth Day of April, 2016

Michelle K. Lee  
*Director of the United States Patent and Trademark Office*